(12) United States Patent
Pinter

(10) Patent No.: US 8,736,934 B2
(45) Date of Patent: May 27, 2014

(54) ASSEMBLY HAVING A DISPLACEABLE PART AND METHOD FOR OPERATING AN ASSEMBLY HAVING A DISPLACEABLE PART

(75) Inventor: Stefan Pinter, Reutlingen (DE)

(73) Assignee: Robert Bosch GmbH, Stuttgart (DE)

(*) Notice: Subject to any disclaimer, the term of this patent is extended or adjusted under 35 U.S.C. 154(b) by 228 days.

(21) Appl. No.: 13/435,507

(22) Filed: Mar. 30, 2012

(65) Prior Publication Data

US 2012/0250128 A1  Oct. 4, 2012

(30) Foreign Application Priority Data

Mar. 31, 2011 (DE) .................. 10 2011 006 598

(51) Int. Cl.
  *G02B 26/08* (2006.01)
  *H01L 41/00* (2013.01)
(52) U.S. Cl.
  USPC .............. 359/199.1; 359/224.1; 310/323.01
(58) Field of Classification Search
  USPC .................. 359/199.1–199.4, 224.1–224.2; 310/309, 311, 321, 323.01
  See application file for complete search history.

(56) References Cited

U.S. PATENT DOCUMENTS

2008/0225363 A1* 9/2008 Saitoh et al. ................. 359/199

FOREIGN PATENT DOCUMENTS

DE 102008059634 6/2010

\* cited by examiner

*Primary Examiner* — James Phan
(74) *Attorney, Agent, or Firm* — Kenyon & Kenyon LLP

(57) ABSTRACT

A component having a mounting support, a displaceable part, which is joined to the mounting support by at least one flexible joining component, and an actuator device. The actuator device is configured to set at least one subunit of the displaceable part and/or of the at least one flexible joining component into a first oscillatory motion along a first axis in such a manner, that the displaceable part may be set into an angular oscillatory motion about a first rotational axis. The actuator device is additionally configured to set the same and/or another subunit into a second oscillatory motion having a motion component along a second axis at an inclination to the first axis, in such a manner, that, in addition to the angular oscillatory motion, the displaceable part is displaceable about a second rotational axis.

15 Claims, 7 Drawing Sheets

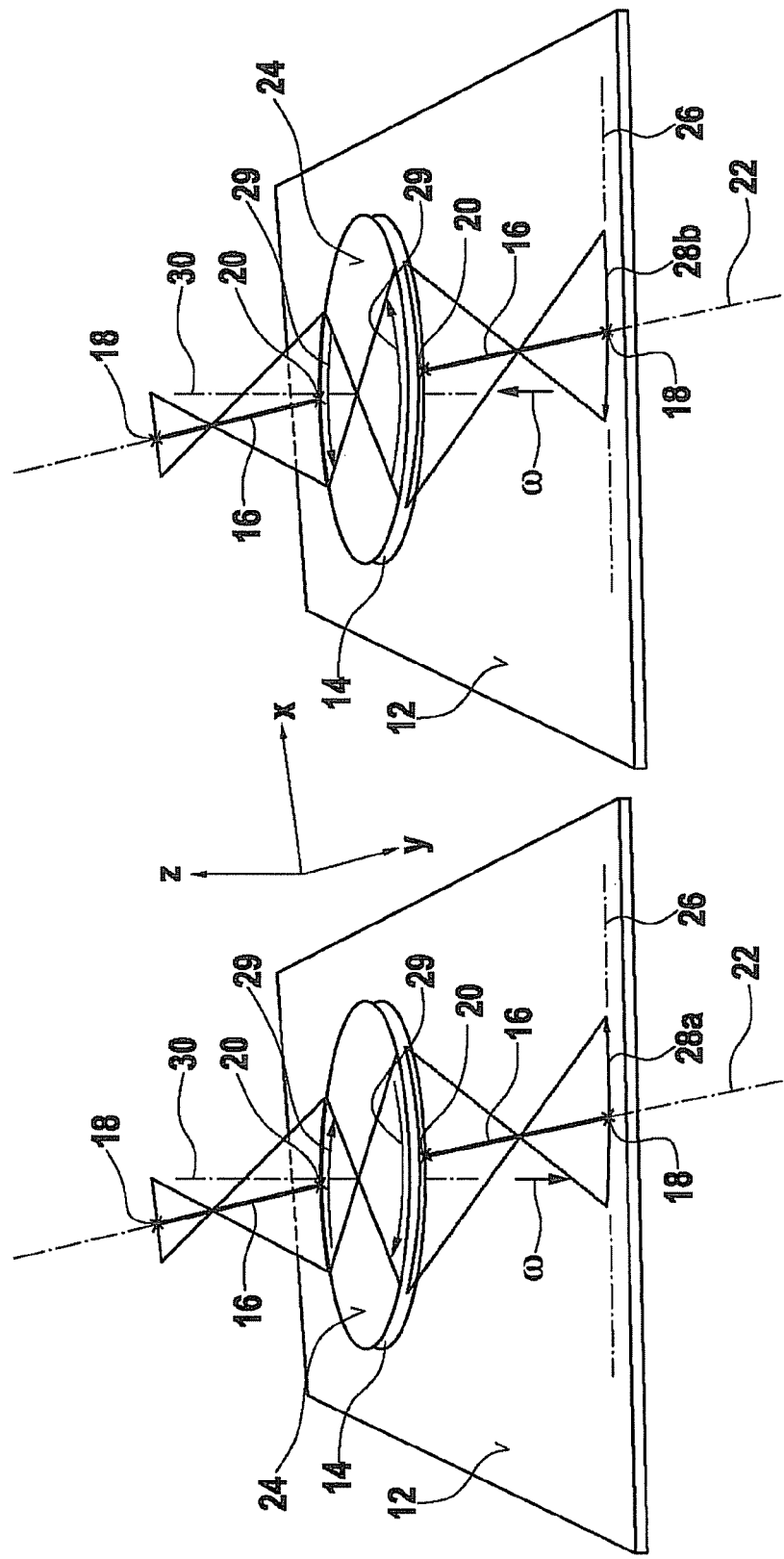

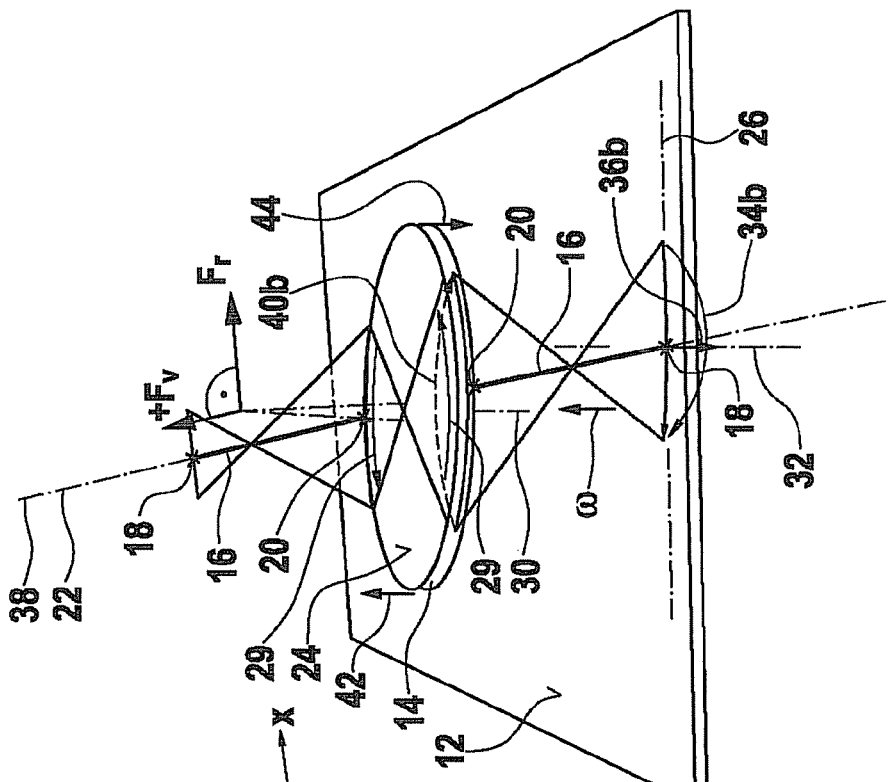
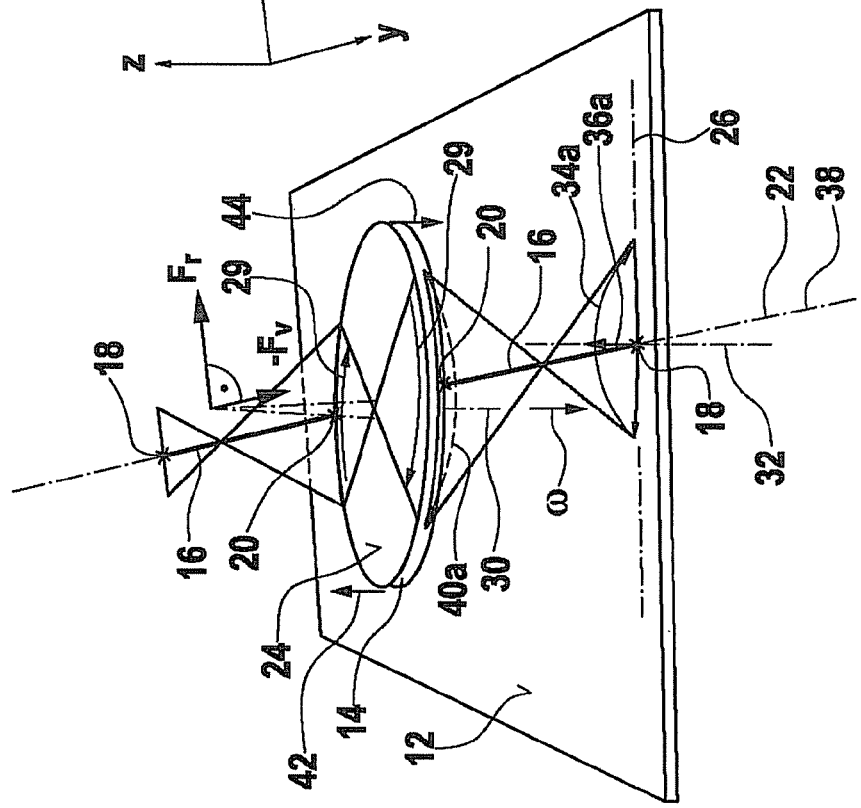

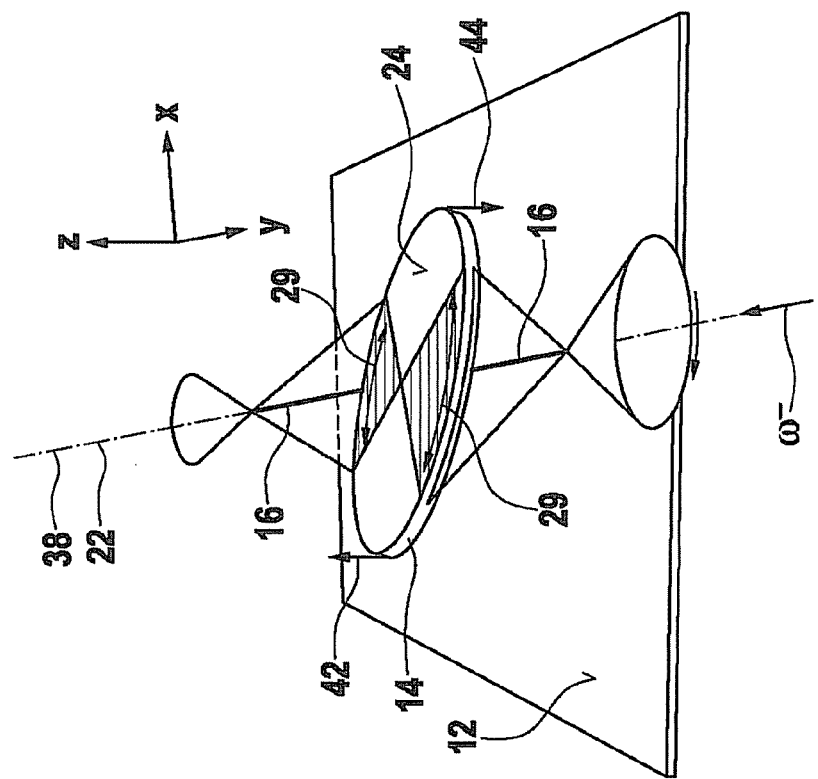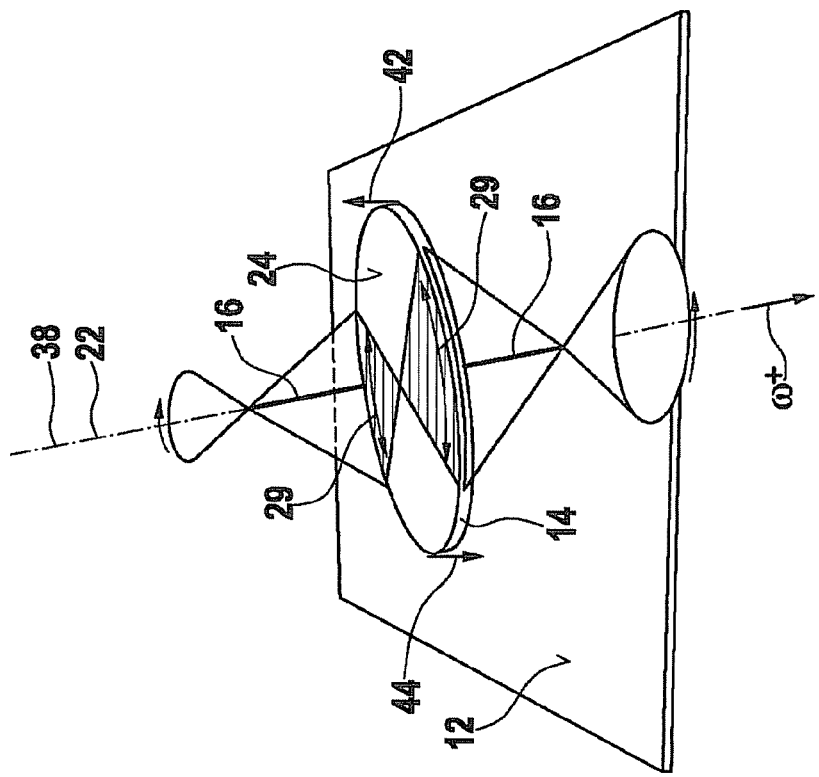

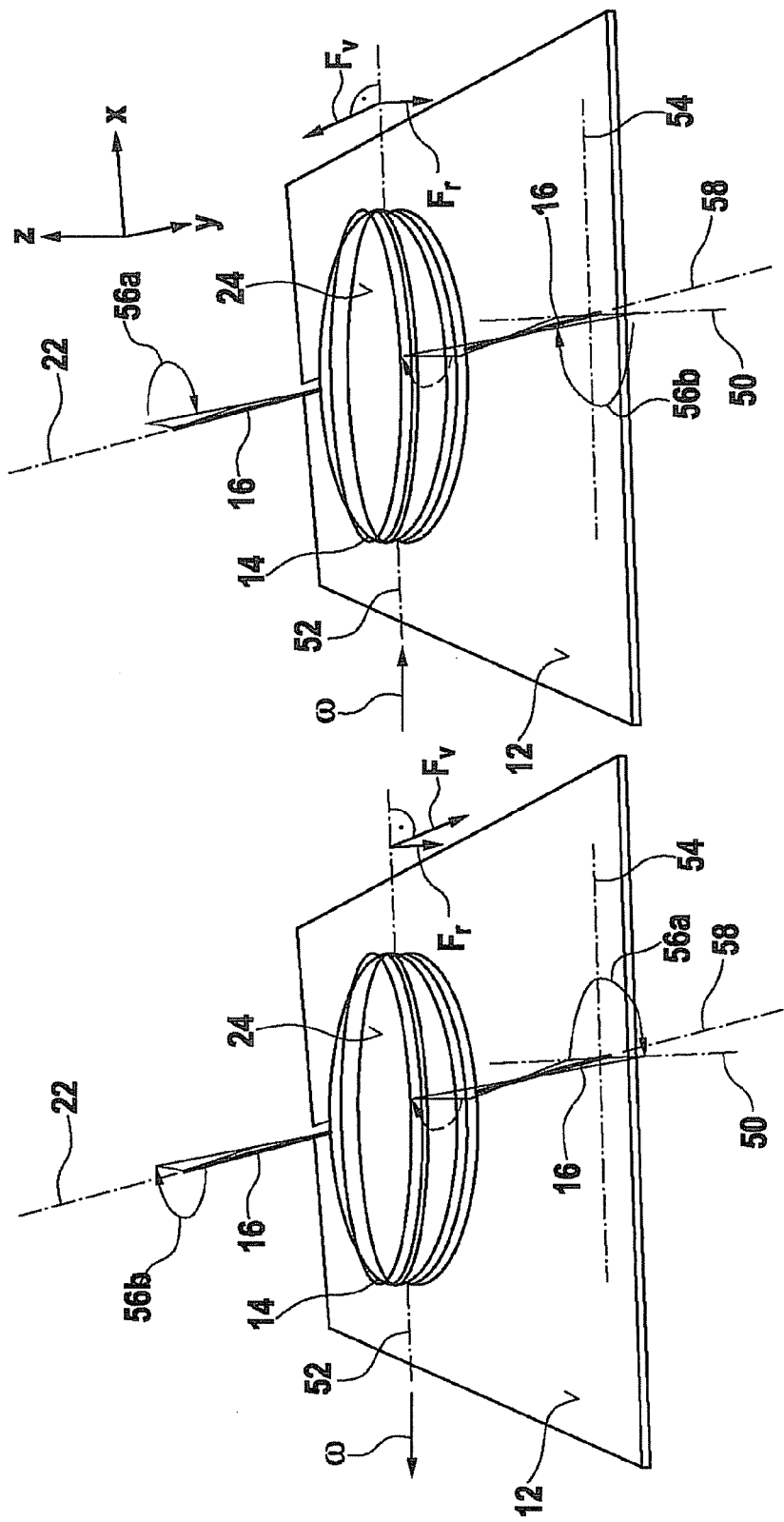

ASSEMBLY HAVING A DISPLACEABLE PART AND METHOD FOR OPERATING AN ASSEMBLY HAVING A DISPLACEABLE PART

CROSS REFERENCE

The present application claims the benefit under 35 U.S.C. §119 of German Patent Application No. DE 102011006598.9 filed on Mar. 31, 2011, which is expressly incorporated herein by reference in its entirety.

FIELD OF THE INVENTION

The present invention relates to an assembly having a displaceable part. In addition, the present invention relates to a method for operating an assembly having a displaceable part.

BACKGROUND INFORMATION

An apparatus having a micromirror that is adjustable with the aid of two electrostatic tilting drives is described in German Patent Application No. DE 102008059634A1. The outer tilting drive has stator electrodes on a rigid outer frame and actuator electrodes on an inner frame. The inner tilting drive includes stator electrodes attached to the inner frame and actuator electrodes that are joined to the micromirror. By suitably controlling the voltages applied between the electrodes of the two tilting drives, the micromirror is intended to be adjustable in two spatial directions.

SUMMARY

The present invention provides an assembly having a displaceable part, and a method for operating an assembly having a displaceable part.

By the use of an actuator device, which is configured to set the at least one outer end of the at least one flexible joining component into oscillatory motion, it is possible, even without an electrostatic drive, to set the displaceable part into the motion including the at least one angular component. Therefore, example embodiments of the present invention increase the number of design options for constructing an assembly having a displaceable part.

In an advantageous manner, the actuator device is additionally configured to set an outer end of the at least one flexible joining component, as a subunit, into the first oscillatory motion and/or into the second oscillatory motion. This may be implemented in a simple manner. However, as an alternative or in addition to an outer end, a middle segment and/or an inner segment of the at least one flexible joining component and/or a subunit of the displaceable part, may be excited.

Preferably, the displaceable part may be set, with respect to the mounting support, into the angular oscillatory motion about the first rotational axis perpendicular to the first axis and/or to a joining axis, on which at least one outer end and at least one inner end of the at least one flexible joining component present in its initial condition are situated; the at least one inner end of the joining component being oriented towards the displaceable part. Thus, the linear oscillatory motion of the at least one outer end that is drivable by the actuator device already ensures an advantageous displaceability of the displaceable part about the first rotational axis.

For example, the displaceable part includes at least one optically active surface. However, the displaceable part may also be configured to be optically active along at least one of its dimensions. Therefore, the displaceability of the displaceable part is usable for a multitude of optical apparatuses.

In one advantageous specific embodiment, the displaceable part takes the form of, for example, a micromirror, optical grating, beam splitter, filter and/or prism. Therefore, a multitude of optical components are adjustable using the assembly of the present invention.

In one advantageous further refinement, the actuator device is additionally configured to set the at least one subunit into the first oscillatory motion along the first axis and into the second oscillatory motion along a second axis that is oriented perpendicular to the first axis with respect to the mounting support. In this case, an advantageous position of the two rotational axes with respect to one another in space is ensured. Alternatively, or in addition, the actuator device may also be configured to set the at least one subunit into the first oscillatory motion along a first axis running perpendicular to the joining axis, and/or into the second oscillatory motion along a second axis running perpendicular to the joining axis with respect to the mounting support. This ensures that the second rotational axis is oriented perpendicular to the first rotational axis. Consequently, the displaceable part is three-dimensionally displaceable in space via an angular motion, which includes both an angular component about the first rotational axis and an angular component about the second rotational axis.

In a further advantageous specific embodiment, the actuator device includes at least one piezoelectric transducer, a magnetic transducer, an electrostatic transducer and/or a thermal transducer.

In addition, with respect to the mounting support, the actuator device may be configured to set the at least one subunit into the first oscillatory motion along the first axis and into the second oscillatory motion along the second axis at the same frequency; the assembly including a control device, which is configured to receive a setpoint signal regarding a setpoint position change of at least one component of the displaceable part, and to stipulate a first setpoint amplitude of the first oscillatory motion, a second setpoint amplitude of the second oscillatory motion and/or a setpoint phase difference in view of the setpoint signal, and to output a corresponding control signal to the actuator device. Using the outputted control signal, the actuator device may be controllable in such a manner, that when setting the at least one outer end into the oscillatory motion, the stipulated, first setpoint amplitude, the stipulated, second setpoint amplitude and/or the stipulated setpoint phase difference are taken into account. In this manner, a specified setpoint position change may be reliably carried out.

In an alternative specific embodiment, the actuator device may additionally be configured to set the at least one subunit into the first oscillatory motion along the first axis at a first frequency, and into the second oscillatory motion along the second axis at a second frequency, with respect to the mounting support. In this case, the assembly preferably includes a control device, which is configured to receive the setpoint signal regarding the setpoint position change of at least the component of the displaceable part, and to stipulate a first setpoint amplitude of the first oscillatory motion and/or a second setpoint amplitude of the second oscillatory motion in view of the setpoint signal, and to output a corresponding control signal to the actuator device. In response to the at least one outer end being excited, the actuator device advantageously maintains the stipulated, first setpoint amplitude and/or the stipulated, second setpoint amplitude. Consequently, in this specific embodiment, it is also feasible to reliably maintain a specified setpoint position change.

In particular, the actuator device may be formed using MEMS technology. This ensures cost-effective and space-saving manufacturability of the actuator device.

The assembly may take the form of a micromechanical component. This design of the assembly that requires little space ensures that it may be used in many areas.

The advantages described above may also be provided by a corresponding method.

BRIEF DESCRIPTION OF THE DRAWINGS

Additional features and advantages of the present invention are explained below, with reference to the figures.

FIGS. 1A through 1C show schematic views of a first specific embodiment of the assembly.

FIGS. 2A and 2B show schematic views of a second specific embodiment of the assembly.

DETAILED DESCRIPTION OF EXAMPLE EMBODIMENTS

Figure 2B:
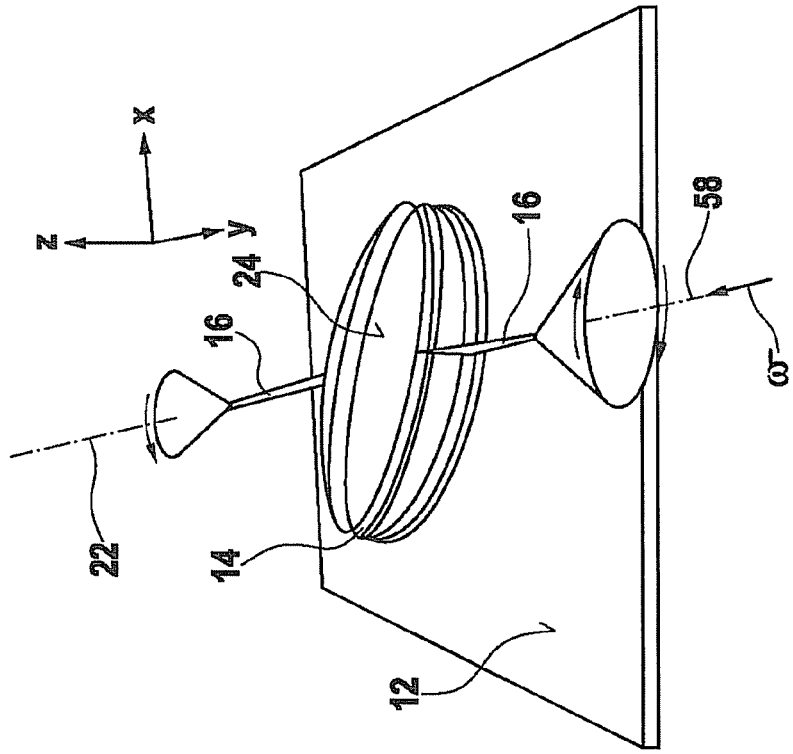
Figure 2B:
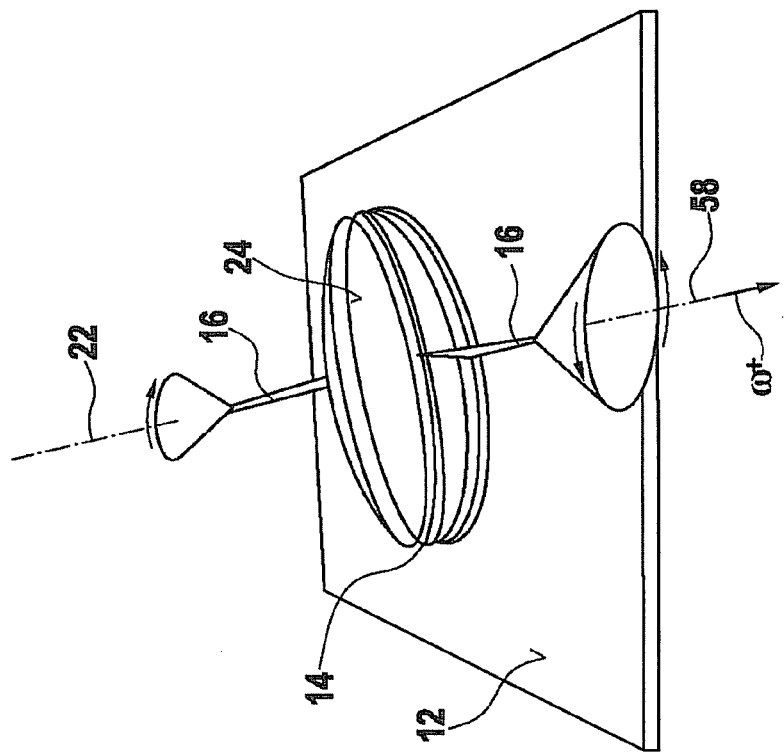

FIG. 1A through 1C show schematic views of a first specific embodiment of the assembly.

The assembly schematically represented in FIGS. 1A through 1C has a mounting support (not shown). The producibility of the mounting support is not limited to the use of a substrate. The assembly also includes a part 14, which is displaceable with respect to the mounting support and an imaginary plane 12 and is joined to the mounting support by at least one flexible joining component 16. The at least one flexible joining component 16 may be, for example, at least one spring, in particular, at least one torsion spring. However, elastic suspension mounts other than the at least one flexible joining component 16 are also possible in place of a spring. In the same manner, a ball bearing or friction bearing may be used in place of, or in addition to, a spring as at least one flexible joining component 16, in order to displaceably connect displaceable part 14 to the mounting support.

The at least one flexible joining component 16 has at least one outer end 18 directed away from displaceable part 14 and at least one inner end 20 oriented towards displaceable part 14. In particular, the at least one inner end 20 may contact displaceable part 14. A joining axis 22 is preferably definable, on which the at least one outer end 18 and the at least one inner end 20 of the at least one flexible joining component 16 present in its starting position/neutral position are situated. The starting position/neutral position of flexible joining component 16 may be understood as its neutral position when the assembly is not in operation. In the specific embodiment illustrated, joining axis 22 runs parallel to plane 12, i.e., parallel to the y axis. However, it should be pointed out that the assembly is not limited to an orientation of joining axis 22 parallel to plane 12. Instead, joining axis 22 may also be oriented at an incline to a flat or curved plane 12.

In the specific embodiment illustrated, the assembly has two torsion springs as flexible joining components 16, which extend along joining axis 22 in their starting positions/neutral positions. However, the number of flexible joining components 16 formed on the assembly is freely selectable.

Displaceable part 14 may take the form of a circular disk, as illustrated. However, the implementability of displaceable part 14 is limited neither to a circular edge, nor to the formation of a flat outer surface. For example, displaceable part 14 may also have an elliptical edge, multi-sided edge and/or a curved outer surface. A three-dimensional shape is also possible.

Displaceable part 14 advantageously has at least one optically active surface, e.g., a mirror surface 24. However, the displaceable part may also be made completely out of an optically active material in at least one of its spatial directions. Consequently, e.g., a micromirror, an optical grating, a beam splitter, a filter and/or a prism may be used as displaceable part 14.

In the specific embodiment illustrated, mirror surface 24 is oriented parallel to the xy plane in its starting position/neutral position. However, the assembly is not limited to an orientation of the mirror surface 24 parallel to plane 12, when the mirror surface is present in its starting position/neutral position.

The assembly also has an actuator device (not shown), whose manufacturability is discussed below in further detail. The method of functioning of the actuator device is described in the following:

As schematically represented in FIGS. 1Aa and 1Ab, in a first operating mode, the actuator device is configured to set the at least one outer end 18 of the at least one flexible joining component 16 into a first oscillatory motion along a first axis 26. However, as an alternative or in addition to an outer end 18, a middle segment and/or an inner segment of the at least one flexible joining component 18 and/or a subunit of displaceable part 14 may be excited.

First axis 26 may be oriented, for example, parallel to plane 12, in particular, parallel to the x axis. However, the actuator device may also be configured to set the at least one outer end 18 into the first (linear) oscillatory motion along an axis inclined with respect to plane 12. Using the actuator device, the at least one outer end 18 may be set into the first oscillatory motion along first axis 26 in such a manner, that the at least one outer end 18 may be displaced in a first motion direction 28a and in a second motion direction 28b opposite to first motion direction 28a. If the assembly has two flexible joining components 16, the actuator device is preferably configured to set its outer ends 16 into the first oscillatory motion in phase opposition.

Using the first oscillatory motion of the at least one outer end 18 along first axis 26 with respect to the mounting support, displaceable part 14 may preferably be set into an angular oscillatory motion about a first rotational axis 30 represented by arrows 29. The angular oscillatory motion may be understood as a (periodic) partial rotational motion having a (varying and direction-changing) angular velocity ω over an angular range less than 360°. In an advantageous manner, first rotational axis 30 is oriented perpendicular to first axis 26 and joining axis 22. For example, first rotational axis 30 is oriented perpendicular to plane 12 and/or parallel to the z axis. However, the orientation of first rotational axis 30 is not limited to a position perpendicular to plane 12 or parallel to the z axis.

The angular oscillatory motion may be produced in that, with the aid of the actuator device, two spring shafts in the form of outer ends 18 are set into (linear) oscillations 180 degrees out of phase along the respective first axes 26 assigned to them. The respective first axes 26 of outer ends 18 may be oriented parallel to one another.

If first rotational axis 30 is oriented perpendicular to an outer surface of displaceable part 14, such as upper mirror surface 24, the angular oscillatory motion of displaceable part 14 about first rotational axis 30 does not cause the outer surface to rotate out of its starting plane. Instead, the outer surface oscillates in its starting plane.

FIGS. 1Ba and 1Bb schematically represent a second operating mode of the actuator device. The actuator device controlled in the second operating mode is configured to set the at least one outer end 18 of the at least one flexible joining component 16 into the first oscillatory motion along first axis 26, having a first motion component (not equal to zero), and into a second oscillatory motion along a second axis 32 inclined with respect to first axis 26, having a second movement component (not equal to zero), with respect to the mounting support. This may be understood to mean that, using the actuator device, the at least one outer end 18 is displaceable in such a manner, that a first projection of the first oscillatory motion (in the form of a first motion component) onto first axis 26 is not equal to zero, and a second projection of the second oscillatory motion (in the form of second motion component) onto second axis 32 is not equal to zero. In this manner, in addition to angular oscillatory motion 29, displaceable part 14 is displaceable about a second rotational axis 38 with respect to the mounting support.

In this context, the at least one outer end 18 executes a motion which includes a first linear oscillatory motion when projected onto first axis 26, and a second linear oscillatory motion when projected onto second axis 32. In this context, the at least one outer end 18 is also moveable along second axis 32 in a first motion direction 36a and in a second motion direction 36b opposite to first motion direction 36a. The at least one outer end 18 may be moved, for example, along a circular or elliptical path made up of two semicircular or semielliptical paths 34a and 34b. The maximum amplitude on first axis 26 and the maximum amplitude on second axis 32 are advantageously out of phase, preferably by 90°.

In particular, the actuator device may be configured in such a manner that the at least one outer end 18 of the at least one flexible joining component 16 is displaceable into a first oscillatory motion (having the first motion component) along first axis 26, and into the second oscillatory motion (having the second motion component) along a second axis 32 oriented perpendicular to first axis 26 (and oriented parallel to the z axis) with respect to the mounting support. In the same manner, with the aid of the actuator device, the at least one outer end 18 may be displaceable into a first oscillatory motion (having the first motion component) along a first axis 26 perpendicular to joining axis 22, and/or into a second oscillatory motion (having a second motion component) along a second axis 32 running perpendicular to joining axis 22 with respect to the mounting support. However, the orientations of first axis 26 and/or second axis 32 mentioned here are only to be understood as exemplary.

One may also change the motion of the at least one outer end 18, so that the linear oscillation executed as a first oscillatory motion is superimposed on the second oscillatory motion along second axis 32 in such a manner, that a circular or elliptical motion of the at least one outer end 18 of the at least one flexible joining component 16 results. The linear oscillation along first axis 26 and the superimposed oscillation along second axis 32 may be out of phase by an angle that is preferably 90 degrees. This ultimately ensures the advantageous motion of displaceable part 14 described in the following.

In an advantageous manner, displaceable part 14 may not only be set into the angular oscillatory motion represented by FIGS. 1Aa and 1Ab. As an alternative to that, by means of (an activation of) the second oscillatory motion of the at least one outer end, displaceable part 14 may additionally be set into a displacing motion about a second rotational axis 38 with respect to the mounting support. Second rotational axis 38 may be oriented, in particular, parallel to joining axis 22.

However, this is only to be understood as exemplary. FIGS. 1Ba and 1Bb each show a half of an oscillation.

The physical causes of the angular motion of displaceable part 14 about second rotational axis 38 are explained in the following:

If an external force acts upon a rotational axis of a rapidly rotating gyroscope, then the gyroscope rotational axis does not tilt in accordance with the acting external force, but deflects in a direction perpendicular to it. This effect on a rotating gyroscope is also referred to as precession (precessional motion). In general, the precession is the change in direction of the rotational axis of a rotating body, such as the rotational axis of a gyroscope, which occurs when an external force exerts a torque on the rotating body. A Coriolis force acts upon the rotating body, the Coriolis force being oriented in accordance with the vector product of the angular velocity of the rotating body and the external force.

The precession described above using a gyroscope as an example may be applied to displaceable part 14, which executes the angular oscillatory motion about first rotational axis 30 due to the first oscillatory motion of the at least one outer end 18 along first axis 26. The superposition of the first oscillatory motion with the additional, second motion component along second axis 32, i.e., the transition from the first oscillatory motion into the second oscillatory motion, is comparable to an "external force" that deflects displaceable part 14 in a direction perpendicular to it.

That is to say, when displaceable part 14 is present in its neutral position, a motion of the at least one outer end 18 including the second oscillatory motion would produce a "virtual motion" of displaceable part 14 corresponding to dashed lines 40a and 40b. Therefore, in addition to the angular oscillatory motion of displaceable part 14 about first rotational axis 30, the displaceable part would behave as if a virtual force $F_v$ would act upon displaceable part 14 in addition to the at least one outer end 18 set into the first angular oscillatory motion. In the specific embodiment illustrated, virtual force $F_v$ is oriented parallel to plane 12, in particular, parallel to the y axis.

However, when the first oscillatory motion is superposed with the additional, second motion component along second axis 32, i.e., at the transition from the first oscillatory motion to the second oscillatory motion, displaceable part 14 executes the angular oscillatory motion about first rotational axis 30 inside of the starting plane. Due to the angular oscillatory motion of displaceable part 14 about first rotational axis 30, virtual force $F_v$ does not cause a displacement of displaceable part 14 in the direction of virtual force $F_v$, but in accordance with a resulting force $F_r$. Resulting force $F_r$ may be derived from the vector product of virtual force $F_v$ and angular velocity ω. In particular, resulting force $F_r$ may be oriented perpendicular to first rotational axis 32 and virtual force $F_v$. In the specific embodiment illustrated, resulting force $F_r$ is oriented parallel to plane 12, in particular, parallel to the x axis. However, the use of the precession is not limited to this orientation of resulting force $F_r$.

With the aid of resulting force $F_r$, the displaceable part 14 set into the angular oscillatory motion is additionally displaceable out of the starting plane (plane of the angular oscillatory motion) about a second rotational axis 38. One may also describe the displacement about second rotational axis 38, such that the ends of the displaceable part pointing away from second rotational axis 38 are set into oppositely-directed tilting motions 42, 44 about second rotational axis 38. As is apparent from the comparison of FIGS. 1Ba and 1Bb, a tilting of displaceable part 14 in the same tilting direction about second rotational axis 38 results for each semielliptical path 34a and 34b of the second oscillatory motion along a rotational direction. In the specific embodiment illustrated, second rotational axis 38 is oriented parallel to plane 12, in particular, parallel to the y axis. However, the implementability of the assembly is not limited to this orientation of second rotational axis 38.

As is apparent from FIGS. 1Ca and 1Cb, the displaceable part may be displaced out of its neutral position, i.e., out of the starting plane (plane of the angular oscillatory motion about first rotational axis 30), into the angular motion in a first displacement direction/tilting direction (FIG. 1Ca) and in a second, opposite displacement direction/tilting direction (FIG. 1Cb) about second rotational axis 38. For an angular motion in the first displacement direction/tilting direction (FIG. 1Ca), the second oscillatory motion of the at least one outer end 18 is excited in a first rotational direction ω+. Accordingly, setting the at least one outer end 18 into the second oscillatory motion in a second rotational direction ω− opposite to first rotational direction ω+ causes the angular motion about second rotational axis 38 in the second displacement direction/tilting direction (FIG. 1Cb).

Using the functions of the actuator device described in the paragraphs above, it is therefore possible to displace displaceable part 14 at least about second rotational axis 38 in such a manner, that mirror surface 24 or another optically active surface of displaceable part 14 assumes a position that is inclined with respect to its neutral position/starting position. Thus, the actuator device may be used as a driving mechanism for displacing displaceable part 14 about at least second rotational axis 38. Mirror surface 24 may be statically guided about second rotational axis 38. Consequently, the advantages of a static displacement (inclination) are achievable. The direction of inclination and the torque may be determined by reversing the excitation motion. Thus, the assembly may be used, for example, for selectively deflecting/projecting a light beam striking mirror surface 24.

FIGS. 2A and 2B show schematic representations of a second specific embodiment of the assembly.

The assembly schematically represented by FIGS. 2Aa and 2B has above-described components 14 and 16, together with an actuator device. However, in the specific embodiment described here, the actuator device (controlled in the first operating mode) is configured to set the at least one outer end 18 of the at least one flexible joining component 16 into a first oscillatory motion along a first axis 50 oriented at an inclination to plane 12. First axis 50 may be oriented, in particular, perpendicular to plane 12, e.g., parallel to the z axis.

With respect to the mounting support, displaceable part 14 may be set, with the aid of the first oscillatory motion of the at least one outer end 18 along first axis 50, into an angular oscillatory motion about a first rotational axis 52 at the (varying and direction-changing) angular velocity c; the first rotational axis not being oriented perpendicular to a neutral position/starting position of an outer surface of displaceable part 14, such as mirror surface 24.

Therefore, with the aid of the first oscillatory motion of the at least one outer end 18, displaceable part 14 is displaceable such that the outer surface of displaceable part 14 may be rotated out of its starting plane about first rotational axis 52. In this manner, with the aid of the first oscillatory motion of the at least one outer end 18, e.g., a light beam directed onto mirror surface 24 may be deflected around first rotational axis 52. That is to say that the angular oscillatory motion about first rotational axis 52 produces a displacement of displaceable part 14, by which its spatial position with respect to the mounting support is changed. FIGS. 2Aa and 2Ab each show half of an oscillation of displaceable part 14.

In particular, first rotational axis 52 may be oriented parallel to plane 12 and/or run perpendicular to joining axis 22. This is ensured, for example, when first rotational axis 52 is oriented parallel to the x axis.

In addition, the actuator device (controlled in the second operating mode) is configured to set the at least one outer end 18 into a second oscillatory motion having a first motion component along first axis 50 and having a second motion component along the second axis 54 running at an incline to first axis 50. In particular, second axis 54 may be oriented perpendicular to the first axis and/or to joining axis 22. The maximum amplitude on first axis 50 and the maximum amplitude on second axis 54 are advantageously out of phase, preferably by 90°. Consequently, with the aid of the actuator device, the at least one outer end 18 is movable into the second oscillatory motion along a circular or elliptical path made up of two semicircular or semielliptical paths 56a and 56b.

In this specific embodiment, using the second oscillatory motion of the at least one outer end 18, the precession already described above also allows displaceable part 14 to be displaceable/rotatable about a second rotational axis 58 in addition to the angular oscillatory motion about first rotational axis 52. One may also describe this effect such that, due to the second oscillatory motion of the at least one outer end 18, the virtual force $F_v$ already described above is additionally exerted on the displaceable part 14 set into the angular oscillatory motion about first rotational axis 52. However, due to the precession, the displaceable part 14 set into the angular oscillatory motion experiences a resulting force $F_r$, which produces a torque about second rotational axis 58. Because of the restoring force of the at least one flexible joining component 16, a constant displacement results when the torque and the restoring force are equal.

One may particularly utilize the advantageous displaceability of displaceable part 14 in that, due to a linear oscillation of the at least one outer end 18 along first axis 50 perpendicular to plane 12, an angular oscillation of the displaceable part about a first rotational axis 50 parallel to plane 12 is excited. By superimposing a further linear oscillation along a second axis 54 parallel to plane 12, the precession may be initiated in such a manner, that the oscillatory axis of displaceable part 14 deflects in a direction perpendicular to it and produces, in each of the half-oscillation periods, an inclination of displaceable part 14 about second rotational axis 58 (in the same rotational direction).

As is apparent from FIGS. 2Ba and 2Bb, changing first rotational direction ω+ of the second oscillatory motion of the at least one outer end 18 to second rotational direction ω−, or changing second rotational direction ω− to first rotational direction ω+, changes the direction of the torque applied to displaceable part 14 about a second rotational axis 58. Consequently, the position of displaceable part 14 with respect to the mounting support about the two rotational axes 52 and 58 is changeable, in each instance, in two rotational directions/inclination directions.

Using the specific embodiment of the assembly described here, e.g., a light beam may be freely deflected in space at mirror surface 24. To that end, mirror surface 24 is rotatable about the two rotational axes 52 and 58 with respect to the mounting support. Preferably, displaceable part 14 is resonantly excited about first rotational axis 52 by the external (e.g., sinusoidal) excitation, but experiences a displacement about second rotational axis 58. However, the adjustability of the position of displaceable part 14 about the two rotational axes 52 and 58 with respect to the mounting support is also useful for other optical and/or mechanical applications.

In particular, the oscillation about first rotational axis 52 may take place in resonance, which may allow a rapid (horizontal) beam-deflection movement. The resonant frequency may be set to a preferred value by selecting a spring constant of the at least one flexible joining component 16, a mass and/or an inertia of displaceable part 14. The displacement angle about second rotational axis 58 may be statically adjusted, using the amplitude, frequency and/or phase difference of the superposed motion. The direction of the displacement or of the producible torque about second rotational axis 58 may be set using the rotational direction/sense of rotation of the excitation motion.

In resonant oscillation systems, energy may be coupled in highly efficiently. In this manner, large displacements are attainable using little excitation energy. In particular, the higher the oscillation frequency about first rotational axis 52, the higher the attainable torque about second rotational axis 58.

A Cardanic suspension is not necessary for the biaxial displaceability of displaceable part 14. Instead, for example, a torsion-spring suspension, which takes the form of at least one flexible joining component 16 and is simpler to manufacture, is sufficient.

Figure 3:
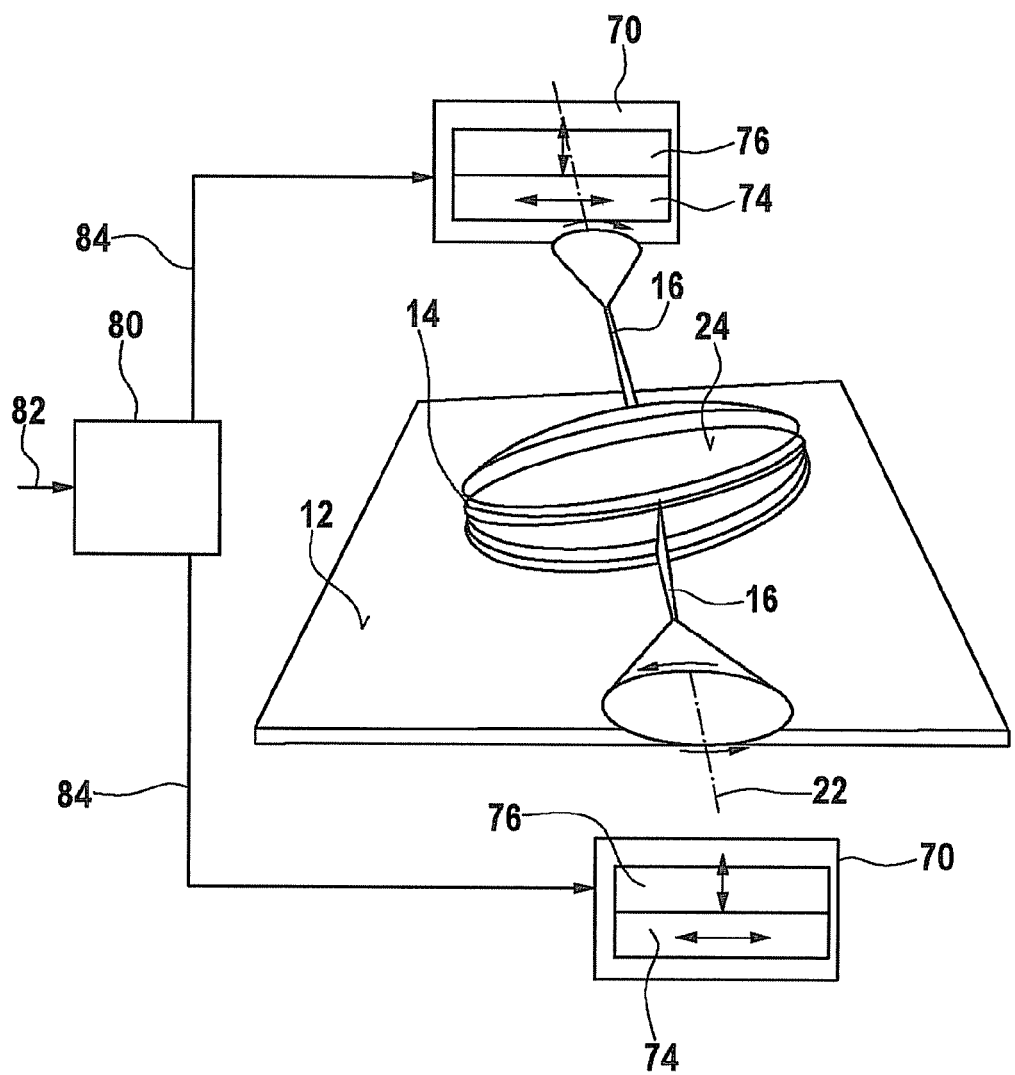
FIG. 3 and FIG. 4 show schematic views of a third and a fourth specific embodiment of the assembly.
Figure 4:
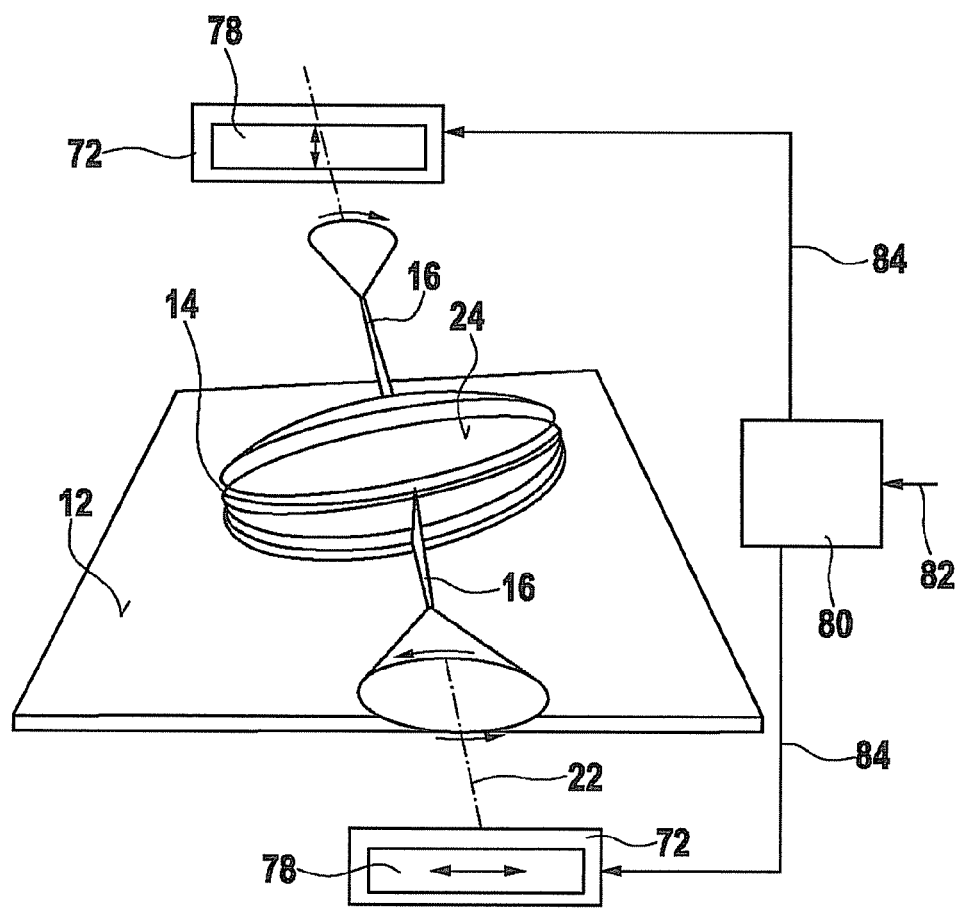

FIG. 3 and FIG. 4 show schematic views of a third and a fourth specific embodiment of the assembly.

The assemblies schematically represented in FIG. 3 and FIG. 4 have the components 14 and 16 already described above, together with an actuator device 70 or 72. Each of the two actuator devices 70 and 72 has at least one piezoelectric transducer 74 to 78. In particular, the piezoelectric transducers 74 to 78 used in actuator devices 70 and 72 of the specific embodiments are advantageously suited for displacing the at least one outer end 18 at high frequencies for both motion components. In addition, comparatively high forces may be applied to the at least one outer end 18 by piezoelectric transducers 74 to 78. However, in place of or in addition to such a piezoelectric transducer 74 to 78, an actuator device 70 and 72 of the assembly may also be provided with at least one transducer following the magnetic, electrostatic or thermal transducer principle.

Actuator device 70 in FIG. 3 has two piezoelectric transducers 74 and 76, whose sensitive axes are oriented at an incline, in particular, perpendicular, to one another. The two piezoelectric transducers 74 and 76 may be positioned one above the other in a simple manner. In contrast, piezoelectric transducer 78 of actuator device 72 of FIG. 4 is configured for a shearing motion (in the x direction) at one outer end 18, and for a motion (in the z direction) at another outer end 18. Using the elements, the excitation of displaceable part 14 is possible in a manner similar to as described above. For example, by positioning the at least one piezoelectric transducer 74 to 78 at the at least one outer end 18 of the at least one flexible joining component 16, the excitation of the circular or elliptical, second oscillatory motion already described above may be carried out.

As an option, the assembly also has a control device 80, which is configured to receive a setpoint signal 82 regarding a setpoint position change of at least one component of displaceable part 14, such as mirror surface 24, and to stipulate, in view of setpoint signal 82, at least one desired quantity regarding the first oscillatory motion and/or the second oscillatory motion, and to output at least one corresponding control signal 84 to actuator device 70 or 72. The at least one stipulable, desired quantity may be, for example, a setpoint amplitude and/or a first setpoint frequency of the first motion component along the first axis, a second setpoint amplitude and/or a second setpoint frequency of the second motion component along the second axis and/or a setpoint phase difference (between the maximum amplitude/displacement of the first motion component and the maximum amplitude/displacement of the second motion component). In the same manner, the at least one stipulable desired quantity may include at least one amplitude, at least one frequency and/or a phase difference of at least one periodic voltage signal, which is provided at the at least one piezoelectric transducer 74 to 78 and/or at a transducer designed according to a different transducer principle. The at least one stipulable desired quantity is not limited to the examples enumerated here. The at least one control signal 84 may be, in particular, such a periodic voltage signal. In all of the specific embodiments, the variable inclination is adjustable by changing the amplitude, the frequency and/or the phase difference of the excitation oscillations.

If the at least one actuator device 70 or 72 is configured to displace the at least one outer end 18 at the same frequency for the first motion component along the first axis and for the second motion component along the second axis with respect to the mounting support, it is advantageous when control device 80 is configured to stipulate, in view of setpoint signal 82, a first setpoint amplitude of the first motion component, a second setpoint amplitude of the second motion component and/or a setpoint phase difference, or at least one corresponding quantity of at least one voltage signal. Using the variables mentioned here, at least one displacement angle between a neutral position/starting position of displaceable part 14 and a position of displaceable part 14 changed about at least one rotational axis with respect to the mounting support may be reliably set.

However, actuator device 70 or 72 may also be configured to displace the at least one outer end 18 at a first frequency for the first motion component along the first axis, and at a second frequency for the second motion component along the second axis, with respect to the mounting support. In this case, control device 80 is preferably configured to stipulate, in view of setpoint signal 82, a first setpoint amplitude and/or a first setpoint frequency for the first motion component along the first axis and/or a second setpoint amplitude and/or a second setpoint frequency for the second motion component along the second axis, or at least one corresponding quantity of at least one voltage signal. In this case, the stipulating of the setpoint phase difference may be omitted in order dispense with unnecessary working steps.

In all of the specific embodiments described here, the assembly may take the form of a micromechanical component. In particular, all of the components of the assembly may be formed on a single chip. In the same manner, individual components may also be installed outside of a chip having the partially formed components on it (ASIC and MEMS chip separate or together on one chip).

The above-described assemblies have the advantage that, in particular, two (preferably sinusoidal) translational oscillations of the at least one outer end of at least one flexible joining component 16 may initiate an angular motion about at least one axis of a displaceable part 14. Since two translational oscillations may be more easily generated than an angular motion, the assemblies may be manufactured cost-effectively and with a high degree of reliability.

It should also be pointed out that an assembly having only one flexible joining component 16 is feasible. In the same way, the above-described excitation of the first oscillatory motion and of the second oscillatory motion may also take place at only one end of a flexible joining component 16. As an alternative to that, it is also possible to set a first outer end of a first flexible joining component 16 into the first oscillatory motion, while a second outer end of a second flexible joining component 16 executes the motion to be superimposed, which has the second motion component along the second axis.

Displaceable part 14 may be constructed in such a manner, that its moments of inertia about the three spatial axes are not equal. In this case, an angular motion about a rotational axis having a medium moment of inertia is not stable. Therefore, by suitably designing the moments of inertia of displaceable part 14, the modes of oscillation that are stable may be determined. In this manner, a rotation about a particular spatial axis may be selectively adjusted.

The above-described assemblies are particularly suited for operating mono-axial or biaxial micromirrors. In the case of these assemblies, the quality of vibration may be additionally increased by vacuum encapsulation. In addition, excitation at a resonance frequency is also possible, which means that displaceable part 14 reacts to the low amplitudes of the excitation with high amplitudes. This results in a high degree of energy that may be coupled in, i.e., a high attainable torque.

The method steps of the method are executed by the above-described assemblies. Therefore, an additional description of the method steps is omitted here.

What is claimed is:

1. An assembly, comprising:
   a mounting support;
   a displaceable part which is joined to the mounting support by at least one flexible joining component; and
   an actuator device, the actuator device being configured to set at least one subunit of at least one of the displaceable part, and of the at least one flexible joining component, into a first oscillatory motion along a first axis with respect to the mounting support, in such a manner, that, with respect to the mounting support, the displaceable part is set into an angular oscillatory motion about a first rotational axis, the actuator device further being configured to set at least one of the same, another subunit of at least one of the displaceable part, and the at least one flexible joining component, into a second oscillatory motion having a motion component along a second axis at an inclination to the first axis with respect to the mounting support, in such a manner, that, in addition to the angular oscillatory motion, the displaceable part is displaceable about a second rotational axis with respect to the mounting support.

2. The assembly as recited in claim 1, wherein the actuator device is further configured to set an outer end of the at least one flexible joining component into at least one of the first oscillatory motion, and the second oscillatory motion, the outer end of the at least one flexible joining component taking the form of a subunit and being directed away from the displaceable part.

3. The assembly as recited in claim 1, wherein, with respect to the mounting support, the displaceable part may be set into the angular oscillatory motion about the first rotational axis perpendicular at least one of to the first axis and to a joining axis, on which at least one outer end and at least one inner end of the at least one flexible joining component in its starting position are situated, the at least one inner end of the joining component being oriented towards the displaceable part.

4. The assembly as recited in claim 3, wherein the actuator device is additionally configured to set the at least one subunit at least one of into the first oscillatory motion along a first axis running perpendicular to the joining axis, and into the second oscillatory motion along a second axis running perpendicular to the joining axis with respect to the mounting support.

5. The assembly as recited in claim 1, wherein the displaceable part includes at least one optically active surface.

6. The assembly as recited in claim 5, wherein the displaceable part is at least one of a micromirror, an optical grating, a beam splitter, a filter and a prism.

7. The assembly as recited in claim 1, wherein, the actuator device is additionally configured to set the at least one subunit into the first oscillatory motion along the first axis and into the second oscillatory motion along a second axis that is oriented perpendicular to the first axis.

8. The assembly as recited in claim 1, wherein the actuator device includes at least one of a piezoelectric transducer, a magnetic transducer, an electrostatic transducer, and a thermal transducer.

9. The assembly as recited in claim 1, wherein, with respect to the mounting support, the actuator device is additionally configured to set the at least one subunit into the first oscillatory motion along the first axis and into the second oscillatory motion along the second axis at an equal frequency, and the assembly includes a control device which is configured to receive a setpoint signal regarding a setpoint position change of at least one component of the displaceable part, and to stipulate at least one of a first setpoint amplitude of the first oscillatory motion, a second setpoint amplitude of the second oscillatory motion, and a setpoint phase difference, in view of the setpoint signal, and to output a corresponding control signal to the actuator device.

10. The assembly as recited in claim 1, wherein, with respect to the mounting support, the actuator device is additionally configured to set the at least one subunit into the first oscillatory motion along the first axis at a first frequency, and into the second oscillatory motion along the second axis at a second frequency, and the assembly includes a control device which is configured to receive the setpoint signal regarding a setpoint position change of at least the component of the displaceable part, and to stipulate at least one of a first setpoint amplitude of the first oscillatory motion, and a second setpoint amplitude of the second oscillatory motion in view of the setpoint signal, and to output a corresponding control signal to the actuator device.

11. The assembly as recited in claim 1, wherein the actuator device is formed using MEMS technology.

12. The assembly as recited in claim 1, wherein the assembly is formed as a micromechanical component.

13. A method for operating an assembly having a mounting support, and a displaceable part which is joined to the mounting support by at least one flexible joining component, the method comprising:
   setting at least one subunit of at least one of the displaceable part and the at least one flexible joining component into a first oscillatory motion along a first axis so that the displaceable part is set into an angular oscillatory motion about a first rotational axis with respect to the mounting support; and
   setting, with respect to the mounting support, the subunit or an additional subunit of the least one of the displaceable part and the at least one flexible joining component into a second oscillatory motion having a motion component along a second axis inclined with respect to the first axis so that in addition to the angular oscillatory motion, the displaceable part is displaced about a second rotational axis with respect to the mounting support.

14. The method as recited in claim 13, further comprising:
   stipulating at least one of a first setpoint amplitude for the first oscillatory motion, a second setpoint amplitude for the second oscillatory motion, and a setpoint phase difference, in view of a setpoint position change of at least one component of the displaceable part; and setting, with respect to the mounting support, the at least one subunit into the first oscillatory motion along the first axis and into the second oscillatory motion along the second axis at an equal frequency, in view of the at least one of the stipulated first setpoint amplitude, the stipulated second setpoint amplitude and the stipulated setpoint phase difference.

15. The method as recited in claim 13, further comprising:

stipulating at least one of a first setpoint amplitude for the first oscillatory motion, and a second setpoint amplitude for the second oscillatory motion, in view of the setpoint position change of at least the component of the displaceable part; and setting, with respect to the mounting support, the at least one subunit into the first oscillatory motion along the first axis at a first frequency, and into the second oscillatory motion along the second axis at a second frequency, in view of the at least one of the stipulated first setpoint amplitude, and the stipulated second setpoint amplitude.

* * * * *